United States Patent
Patra

(10) Patent No.: US 8,514,372 B1
(45) Date of Patent: Aug. 20, 2013

(54) METHOD FOR SETTING AN ILLUMINATION GEOMETRY FOR AN ILLUMINATION OPTICAL UNIT FOR EUV PROJECTION LITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/732,900

(22) Filed: Jan. 2, 2013

Related U.S. Application Data

(60) Provisional application No. 61/592,038, filed on Jan. 30, 2012.

(30) Foreign Application Priority Data

Jan. 30, 2012 (DE) .................. 10 2012 201 235

(51) Int. Cl.
*G03B 27/54* (2006.01)
*G03B 27/32* (2006.01)

(52) U.S. Cl.
USPC ............................................. 355/67; 355/77

(58) Field of Classification Search
USPC .............. 355/52, 53, 55, 67, 71, 77; 359/861
See application file for complete search history.

(56) References Cited

U.S. PATENT DOCUMENTS

| | | | |
|---|---|---|---|
| 6,438,199 B1 | 8/2002 | Schultz et al. | |
| 6,658,084 B2 | 12/2003 | Singer | |
| 6,859,515 B2 | 2/2005 | Schultz et al. | |
| 7,362,414 B2* | 4/2008 | Singer et al. | 355/30 |
| 7,969,556 B2* | 6/2011 | Deguenther | 355/67 |
| 8,174,677 B2* | 5/2012 | Ossmann et al. | 355/67 |
| 2008/0013680 A1 | 1/2008 | Singer et al. | |
| 2011/0001947 A1 | 1/2011 | Dinger et al. | |
| 2011/0085151 A1 | 4/2011 | Deguenther | |

FOREIGN PATENT DOCUMENTS

| | | |
|---|---|---|
| DE | 10 2008 009 600 | 2/2008 |
| DE | 10 2009 045 694 | 4/2011 |
| EP | 1 225 481 A2 | 7/2002 |
| WO | WO 2009/100856 | 8/2009 |

OTHER PUBLICATIONS

German Examination Report, with English translation, for corresponding DE Appl No. 10 2012 201 235.4, dated Aug. 8, 2012.

(Continued)

*Primary Examiner* — Hung Henry Nguyen
(74) *Attorney, Agent, or Firm* — Fish & Richardson P.C.

(57) ABSTRACT

A method for setting an illumination geometry for an illumination optical unit for EUV projection lithography is disclosed. The method includes defining a desired illumination geometry, followed by varying tilting angles of individual mirrors of the a facet mirror within one and the same individual-mirror group. In a first tilting position, the individual mirrors are assigned via a first group-mirror illumination channel to a first facet of a second facet mirror. In at least one further tilting position, the individual mirrors are assigned either via a further illumination channel to a further facet of the second facet mirror or to a switch-off illumination channel. The tilting angle variation is carried out until an actual illumination geometry corresponds to the desired illumination geometry within predefined tolerances.

6 Claims, 6 Drawing Sheets

(56) References Cited

OTHER PUBLICATIONS

E. L. Lawler and D. E. Wood, "Branch-and-Bound Methods: A Survey*", Operations Research, pp. 699-719, vol. 14 (1966).

Decision to Grant, with English translation, issued by the German Patent and Trademark Office in connection with German priority application DE 10 2012 201 235.4, dated Apr. 25, 2013.

* cited by examiner

METHOD FOR SETTING AN ILLUMINATION GEOMETRY FOR AN ILLUMINATION OPTICAL UNIT FOR EUV PROJECTION LITHOGRAPHY

CROSS-REFERENCE TO RELATED APPLICATIONS

This application claims priority under 35 U.S.C. §119(e) to U.S. Provisional Patent Application Ser. No. 61/592,038, filed Jan. 30, 2012, and this application claims benefit under 35 U.S.C. §119 of German patent application Serial No. 10 2012 201 235.4, filed Jan. 30, 2012. The entire contents of both applications are incorporated herein by reference.

FIELD

The disclosure relates to a method for setting an illumination geometry for an illumination optical unit for EUV projection lithography. Furthermore, the disclosure relates to a method for projection exposure for producing a micro- or nanostructured component, in particular a semiconductor chip, with the aid of a projection exposure apparatus whose illumination optical unit provides a correspondingly set illumination geometry.

BACKGROUND

An illumination optical unit for use in EUV projection lithography is known from US 2011/0001947 A1.

DE 10 2008 009 600 A1 and DE 10 2009 045 694 A1 disclose methods for adjustment of an illumination geometry for projection exposure devices

SUMMARY

The disclosure seeks to provide a method for setting an illumination optical unit that includes a facet mirror having a plurality of individual mirrors which can be switched between at least two tilting positions, wherein the method allows a fine predefinition of a desired illumination geometry.

It has been recognized according to the disclosure that not all of the individual mirrors of an individual-mirror group have to contribute to the illumination of one and the same facet of the second facet mirror via one and the same group-mirror illumination channel. Rather, it is possible to bring specific individual mirrors within an individual-mirror group into at least one further tilting position by which the illumination light is applied to a different facet of the second facet mirror for predefining a further illumination direction or by which the illumination light is guided away in a defined manner such that it does not contribute to the illumination of the object field. The setting method according to the disclosure utilizes the possibilities of this further tilting position in that a predefined desired illumination geometry is approximated as well as possible via a tilting angle variation. The illumination geometry is a predefined distribution of an illumination intensity and/or of an illumination angle over the object field. The illumination angle distribution is also designated as illumination setting. The facets of the second facet mirror can contribute to the imaging of the individual-mirror groups of the first facet mirror either by themselves or in interaction with subsequent components of the illumination optical unit. A group-mirror illumination channel is the totality of all the individual-mirror illumination channels of an individual-mirror group which complement one another on account of the imaging of the individual-mirror group into the object field by one and the same associated facet of the second facet mirror for illuminating the entire object field. If the individual mirror in the further tilting position is assigned by the further illumination channel to the further facet of the second facet mirror, the further illumination channel can be an individual-mirror illumination channel or else a group illumination channel. An individual-mirror group can be regarded as an original image or preimage of the object field. A plurality of such individual-mirror groups for example more than ten, more than 50 or more than 100, such individual-mirror groups contribute to the illumination. The illumination of the object field constitutes an imaging superposition of the original images (a superposition of all the imaged original images in the object field). A correspondence of the actual illumination geometry achieved in the case of a respective tilting position distribution to the predefined desired illumination geometry can be effected by measuring the illumination intensities and/or illumination angles over the object field or by calculating the ray guiding via the individual mirrors within the illumination optical unit. A mixed illumination can be brought about by guiding the illumination light within one and the same individual-mirror group via two different facets of the second facet mirror via a corresponding tilting position distribution of the individual mirrors, in which case mixed illumination a first illumination angle distribution is applied to parts of the object field and a second illumination angle distribution is applied to other parts of the object field. By predefining a tilting position distribution in which switch-off illumination channels are present, it is possible to achieve an influencing of an intensity distribution over an image field height. Tilting position distributions in which both a mixed illumination and switch-off illumination channels are present are also possible. It is also possible to adapt the illumination optical unit to properties of a light source that generates the illumination light.

In one aspect, the disclosure provides a method for setting an illumination geometry for an illumination optical unit for EUV projection lithography for guiding illumination light toward an object field in which a lithography mask can be arranged. The illumination optical unit includes first and second facet mirrors, with the second facet mirror being downstream of the first facet mirror. The first facet mirror has a plurality of individual mirrors which can be switched between at least two tilting positions and which provide individual-mirror illumination channels for guiding illumination light partial beams toward the object field. The second facet mirror has a plurality of facets, each of which contributes to the imaging of a group of the individual mirrors of the first facet mirror into the object field via a group-mirror illumination channel. The images of the individual mirrors of the first facet mirror in a respective individual-mirror group in the object field complement one another for illumination of the entire object field. The method includes predefining a desired illumination geometry, and varying tilting angles of the individual mirrors of the first facet mirror within one and the same individual-mirror group. In a first tilting position, the individual mirrors of the first facet mirror are assigned to a first facet of the second facet mirror via a first group-mirror illumination channel. In at least one further tilting position, the individual mirrors are assigned to a further facet of the second facet mirror via a further illumination channel, or the individual mirrors are assigned to a switch-off illumination channel by which the illumination light guided via the individual mirrors does not contribute to the illumination of the object field. Tilting position distributions of the individual mirrors within the individual-mirror group are permitted in which at least one first tilting position and at least one further tilting position are present until an actual illumination geometry corresponds to the desired illumination geometry within predefined tolerances.

In some embodiments, the variation of the tilting angles of the individual mirrors of the first mirror is carried out for all the individual-mirror groups which are respectively assigned to a dedicated second facet via a dedicated group-mirror illumination channel. Such an embodiment can fully utilize the possibilities of the first facet mirror subdivided into the plurality of individual mirrors.

In another aspect, the disclosure provides a method for projection exposure. The method includes providing a projection exposure apparatus which includes an illumination system including an illumination optical unit for guiding illumination light toward an object field in which a lithography mask can be arranged. The projection exposure apparatus also includes a projection optical unit for imaging the object field into an image field. The projection exposure apparatus further includes an EUV light source, an object holder for mounting the lithography mask in the object field, and a wafer holder for mounting a wafer in the image field. The method also includes setting an illumination geometry as disclosed herein, providing the wafer, providing the lithography mask, and projecting at least one part of the lithography mask onto a region of a light-sensitive layer of the wafer with the aid of the projection optical unit of the projection exposure apparatus. The advantages of such a projection exposure method corresponds to those noted above with reference to the setting method.

In some embodiments, the desired illumination geometry is predefined depending on the structure to be imaged on the lithography mask. Such a predefinition of the desired illumination geometry can lead to an optimized adaptation of the illumination geometry to the structure to be imaged. Illumination light components which do not contribute to the imaging in the case of the structure currently to be imaged can, for example, be switched off or fed to illumination directions in which an imaging contribution is present.

A component produced by such a method for projection exposure can be produced with extremely high structural resolution. In this way it is possible, for example, to produce a semiconductor chip having an extremely high integration or storage density.

BRIEF DESCRIPTION OF THE DRAWINGS

Exemplary embodiments of the disclosure are explained in greater detail below with reference to the drawing, in which.

DETAILED DESCRIPTION

Figure 1:
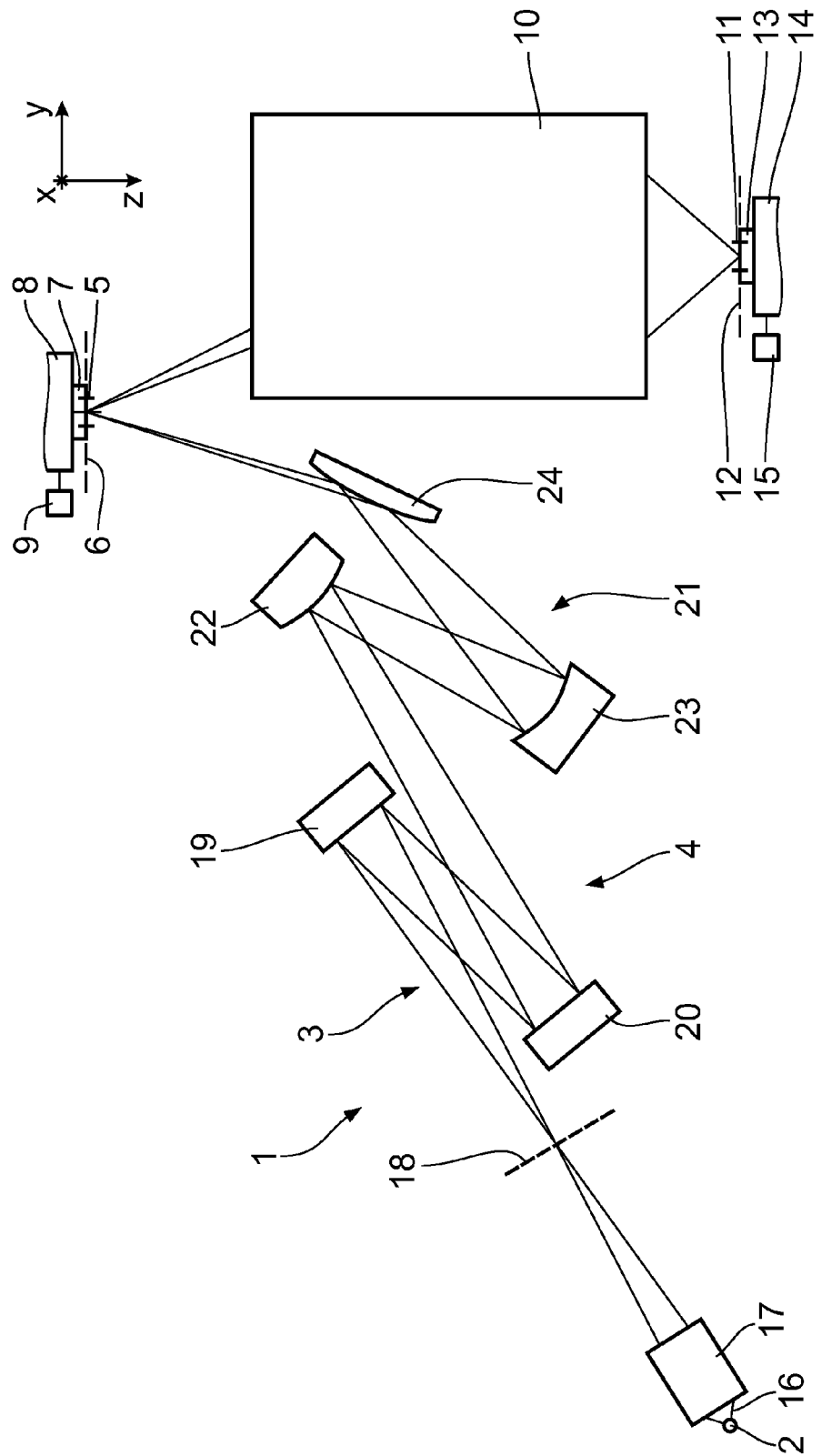
FIG. 1 schematically shows a meridional section through a projection exposure apparatus for EUV projection lithography.

FIG. 1 schematically shows in a meridional section a projection exposure apparatus 1 for microlithography. The projection exposure apparatus 1 includes a light or radiation source 2. An illumination system 3 of the projection exposure apparatus 1 has an illumination optical unit 4 for exposing an illumination field coinciding with an object field 5 in an object pane 6. The illumination field can also be larger than the object field 5. In this case, an object in the form of a reticle 7 arranged in the object field 5, the reticle being held by an object or reticle holder 8, is exposed. The reticle 7 is also designated as a lithography mask. The object holder 8 is displaceable along a displacement direction via an object displacement drive 9. A projection optical unit 10 images the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14 which is likewise displaceable along the displacement direction in a manner synchronized with the object holder 8 via a wafer displacement drive 15.

The radiation source 2 is an EUV radiation source having an emitted used radiation in the range of between 5 nm and 30 nm. This can be a plasma source, for example a GDPP (gas discharge-produced plasma) source or an LPP (laser-produced plasma) source. A radiation source based on a synchrotron or on a free electron laser (FEL) can also be used for the radiation source 2. Information about such a radiation source can be found by the person skilled in the art for example from U.S. Pat. No. 6,859,515 B2. EUV radiation 16 emerging from the radiation source 2 is concentrated by a collector 17. A corresponding collector is known from EP 1 225 481 A. Downstream of the collector 17, the EUV radiation 16 propagates through an intermediate focal plane 18 before it impinges on a field facet mirror 19. The field facet mirror 19 is a first facet mirror of the illumination optical unit 4. The field facet mirror 19 has a multiplicity of individual mirrors (not illustrated in FIG. 1). The field facet mirror 19 is arranged in a plane of the illumination optical unit 4 which is optically conjugate with respect to the object plane 6.

The EUV radiation 16 is also designated hereinafter as illumination light or as imaging light.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate with respect to the intermediate focal plane 18 and with respect to a pupil plane of the projection optical unit 10 or coincides with the pupil plane. The pupil facet mirror 20 has a plurality of pupil facets (not illustrated in FIG. 1). With the aid of the pupil facets of the pupil facet mirror 20 and a downstream imaging optical assembly in the form of a transfer optical unit 21 including mirrors 22, 23 and 24 designated in the order of the beam path, individual-mirror groups 24a (FIG. 7) of the field facet mirror 19, which are described in even greater detail below, are imaged into the object field 5. The last mirror 24 of the transfer optical unit 21 is a mirror for grazing incidence ("grazing incidence mirror").

In order to facilitate the description of positional relationships, FIG. 1 depicts a Cartesian xyz coordinate system as a global coordinate system for the description of the positional relations of components of the projection exposure apparatus 1 between the object plane 6 and the image plane 12. The x-axis runs perpendicularly to the plane of the drawing into the latter in FIG. 1. The y-axis runs toward the right and parallel to the displacement direction of the object holder 9 and of the wafer holder 14 in FIG. 1. The z-axis runs downward in FIG. 1, that is to say perpendicularly to the object plane 6 and the image plane 12.

The x-dimension over the object field 5 or the image field 11 is also designated as the field height.

Figure 2:
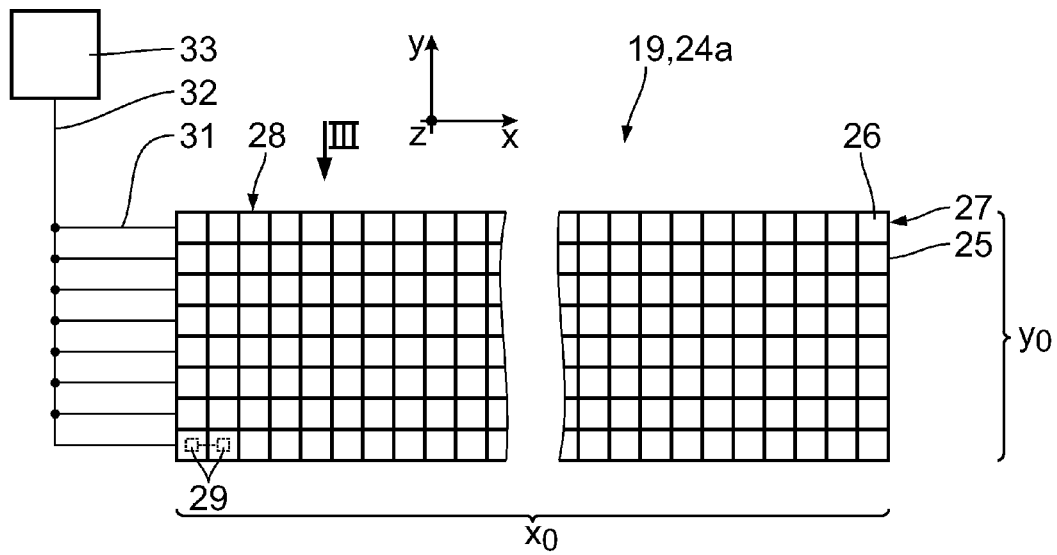
FIG. 2 schematically shows a plan view of an excerpt from a field facet mirror constructed from individual mirrors, for use in the projection exposure apparatus according to FIG. 1.

FIG. 2 shows details of the construction of an excerpt from the field facet mirror 19 in a highly schematic illustration. The excerpt from the field facet mirror 19 as illustrated in FIG. 2 can be exactly one of the individual-mirror groups 24a. An entire reflection surface 25 of the field facet mirror 19 is subdivided in rows and columns into a grid of individual mirrors 26. Partial beams of the illumination light 16 are guided via the respective individual mirrors 26. The individual reflection surfaces of the specific individual mirrors 26 are planar and have no curvature. An individual-mirror row 27 has a plurality of the individual mirrors 26 situated directly alongside one another. Tens to hundreds of the individual mirrors 26 can be provided in an individual-mirror row 27. In the example according to FIG. 2, the individual mirrors 26 are square. Other shapes of individual mirrors which enable the reflection surface 20 to be covered as far as possible without any gaps can also be used. Such alternative individual-mirror shapes are known from the mathematical theory of parketing. In this connection, reference should be made to the references indicated in WO 2009/100 856 A1.

Depending on the embodiment of the field facet mirror 19, an individual-mirror column 28 likewise has a plurality of the individual mirrors 26. By way of example, a few, a few tens or a few hundreds of the individual mirrors 26 are provided per individual-mirror column 28.

In order to facilitate the description of positional relationships, FIG. 2 depicts a Cartesian xyz coordinate system as a local coordinate system of the field facet mirror 19. Corresponding local xyz coordinate systems are also found in the subsequent figures shown in facet mirrors or an excerpt therefrom in plan view. In FIG. 2, the x-axis runs horizontally toward the right parallel to the individual-mirror rows 27. The y-axis runs upward parallel to the individual-mirror columns 28 in FIG. 2. The z-axis is perpendicular to the plane of the drawing in FIG. 2 and runs out of the latter.

The y-direction of the global coordinate system according to FIG. 1, that is to say the displacement direction for the reticle 7 and the wafer 13, and the y-direction of the local coordinate system according to FIG. 2, that is to say the column direction of the individual-mirror array, need not run exactly parallel to one another, but rather can assume a, for example small, angle with respect to one another.

In the x-direction, the reflection surface 25 of the individual-mirror group 24a has an extent of $x_0$. In the y-direction, the reflection surface 25 of the individual-mirror group 24a has an extent of $y_0$.

Depending on the embodiment of the field facet mirror 19, the individual mirrors 26 have x/y extents in the range of, for example, from 500 μm×500 μm to, for example, 2 mm×2 mm. The individual mirrors 26 can be shaped such that they have a concentrating effect for the illumination light 16. Such a concentrating effect of the individual mirrors 26 is advantageous particularly when using divergent illumination of the field facet mirror 19 with the illumination light 16. The entire field facet mirror 19 has an $x_0/y_0$ extent which, depending on the embodiment, is, for example, 300 mm×300 mm or 600 mm×600 mm. The individual-mirror groups 24a (cf. FIG. 7) have typical x/y extents of 80 mm×6 mm or of 65 mm×5 mm or of 25 mm×4 mm or of 104 mm×8 mm. Depending on the ratio between the size of the respective individual-mirror groups 24a and the size of the individual mirrors 26 from which the individual-mirror groups 24a are constructed, each of the individual-mirror groups 24a has a corresponding number of individual mirrors 26.

Figure 3:
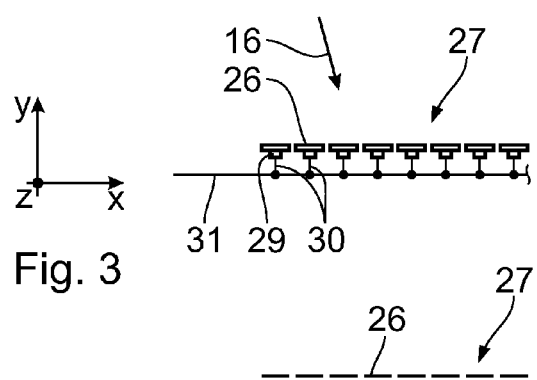
FIG. 3 shows a view of an excerpt from an individual-mirror row of the facet mirror according to FIG. 2 from viewing direction III in FIG. 2.

For the individual deflection of impinging illumination light 16, each of the individual mirrors 26 is respectively connected to an actuator 29, as indicated by dashed lines in FIG. 2 on the basis of two individual mirrors 26 arranged in a corner at the bottom left of the reflection surface 25, and as illustrated in greater detail in FIG. 3 on the basis of an excerpt from an individual-facet row 27. The actuators 29 are arranged on that side of each of the individual mirrors 26 which faces away from a reflective side of the individual mirrors 26. The actuators 29 can be embodied as piezo-actuators, for example. Configurations of such actuators are known from the construction of micromirror arrays.

The actuators 29 of an individual-mirror row 27 are respectively connected via signal lines 30 to a row signal bus 31. An individual-mirror row 27 is assigned in each case to one of the row signal buses 31. The row signal buses 31 of the individual-mirror rows 27 are connected, for their part, to a main signal bus 32. The latter is signal-connected to a control device 33 of the field facet mirror 19. The control device 33 is designed, in particular, for driving the individual mirrors 26 jointly in a serial fashion, that is to say row by row or column by column. Individual driving of the individual mirrors 26 is possible even within the individual-mirror rows 27 and the individual-mirror columns 28.

Each of the individual mirrors 26 can be tilted individually independently about two mutually perpendicular tilting axes, wherein a first of the tilting axes runs parallel to the x-axis and the second of these two tilting axes runs parallel to the y-axis. The two tilting axes lie in the individual reflection surfaces of the respective individual mirrors 26.

In addition, an individual displacement of the individual mirrors 26 in the z-direction is also possible via the actuators 29. The individual mirrors 26 are therefore displaceable in a drivable manner separately from one another along a normal to the reflection surface 25. As a result, the topography of the reflection surface 25 overall can be changed. This is illustrated highly schematically by way of example with reference to FIGS. 4 to 6. It is thereby possible to produce even contours of the reflection surface having large sagittas, that is to say large variations in the topography of the reflection surface, in the form of mirror segments arranged overall in one plane in the manner of Fresnel lenses. A basic curvature of such a mirror surface topography having a large sagitta is eliminated by such subdivision into segments in the manner of Fresnel zones.

Figure 4:
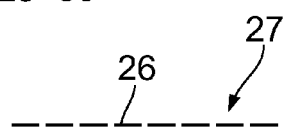
FIGS. 4 to 6 show different, highly schematical forms of a row reflection surface formed from the individual mirrors of the individual-mirror row illustrated in FIG. 3, in three different configurations.

FIG. 4 shows individual reflection surfaces of the individual mirrors 26 of an excerpt from an individual-mirror row 27, wherein all the individual mirrors 26 of the individual-mirror row 27 are put into the same absolute z-position via the control device 33 and the actuators 29. This results in a planar row reflection surface of the individual-mirror row 27. If all the individual mirrors 26 of the field facet mirror 19 are oriented in accordance with FIG. 4, the entire reflection surface 25 of the field facet mirror 19 is planar.

Figure 5:
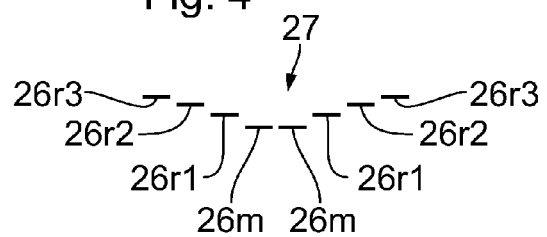

FIG. 5 shows driving of the individual mirrors 26 of the individual-mirror row 27, in which the central individual mirror $26_m$ is set in a manner offset in the negative z-direction relative to adjacent individual mirrors $26_{r1}$, $26_{r2}$, $26_{r3}$. This results in a stepped arrangement that leads to a corresponding phase offset of the EUV radiation 16 impinging on the individual-mirror row 27 according to FIG. 5. In this case, the EUV radiation 16 reflected from the two central individual mirrors $26_m$ is phase-delayed to the greatest extent. The marginal individual mirrors $26_{r3}$ generate the least phase delay. The intervening individual mirrors $26_{r1}$, $26_{r2}$ correspondingly generate in a stepwise manner a phase delay that becomes increasingly less proceeding from the phase delay as a result of the central individual mirrors $26_m$.

Figure 6:
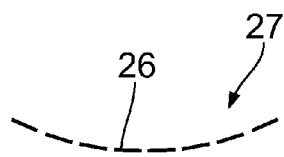

FIG. 6 shows driving of the individual mirrors 26 of the illustrated excerpt from the individual-mirror row 27 in such a way that the offset of the individual mirrors 26 relative to one another in the z-direction, on the one hand, and the orientation of the individual mirrors 26 with respect to one another, on the other hand, result overall in a convexly shaped individual-mirror row 27. This can be used to produce an imaging effect of individual-mirror groups of the field facet mirror 19. In the same way, of course, for example a concave arrangement of groups of the individual mirrors 26 is also possible.

Corresponding designs, as explained above with reference to FIGS. 5 and 6, are not restricted to the x-dimension, but rather, depending on the driving by mechanism of the control device 33, can also be continued over the y-dimension of the field facet mirror 19.

A predefined tilting grouping of the individual mirrors 26 in the individual-mirror groups 24a each composed of at least two individual mirrors 26, as already mentioned above, can be set by the individual driving of the actuators 29 via the control device 33. The individual-mirror groups 24a are respectively assigned via at least one dedicated group-mirror illumination channel for the illumination light 16 to at least one dedicated pupil facet of the pupil facet mirror 20 for imaging the individual-mirror group 24a into the object field 5. This assignment is effected by predefinition of the respective tilting position or switching position of the individual mirrors 26 belonging to the individual-mirror group 24a in such a way that the partial beam of the illumination light 16 which impinges on the respective individual mirror 26 is reflected from this individual mirror 26 toward the assigned pupil facet of the pupil facet mirror 20 and from there toward the object field 5. In this case, the group-mirror illumination channel is the totality of all the individual-mirror illumination channels of the respective individual-mirror group 24a which complement one another on account of the imaging via the pupil facet for illuminating the entire illumination or object field 5. Each of the individual-mirror groups 24a can therefore be regarded as an original image of the illumination field 5. The total illumination of the illumination or object field 5 then constitutes a superposition of these original images.

Each of the individual-mirror groups 24a therefore respectively has the function of a facet of a field facet mirror such as is disclosed for example in U.S. Pat. No. 6,438,199 B1 or U.S. Pat. No. 6,658,084 B2.

Figure 7:
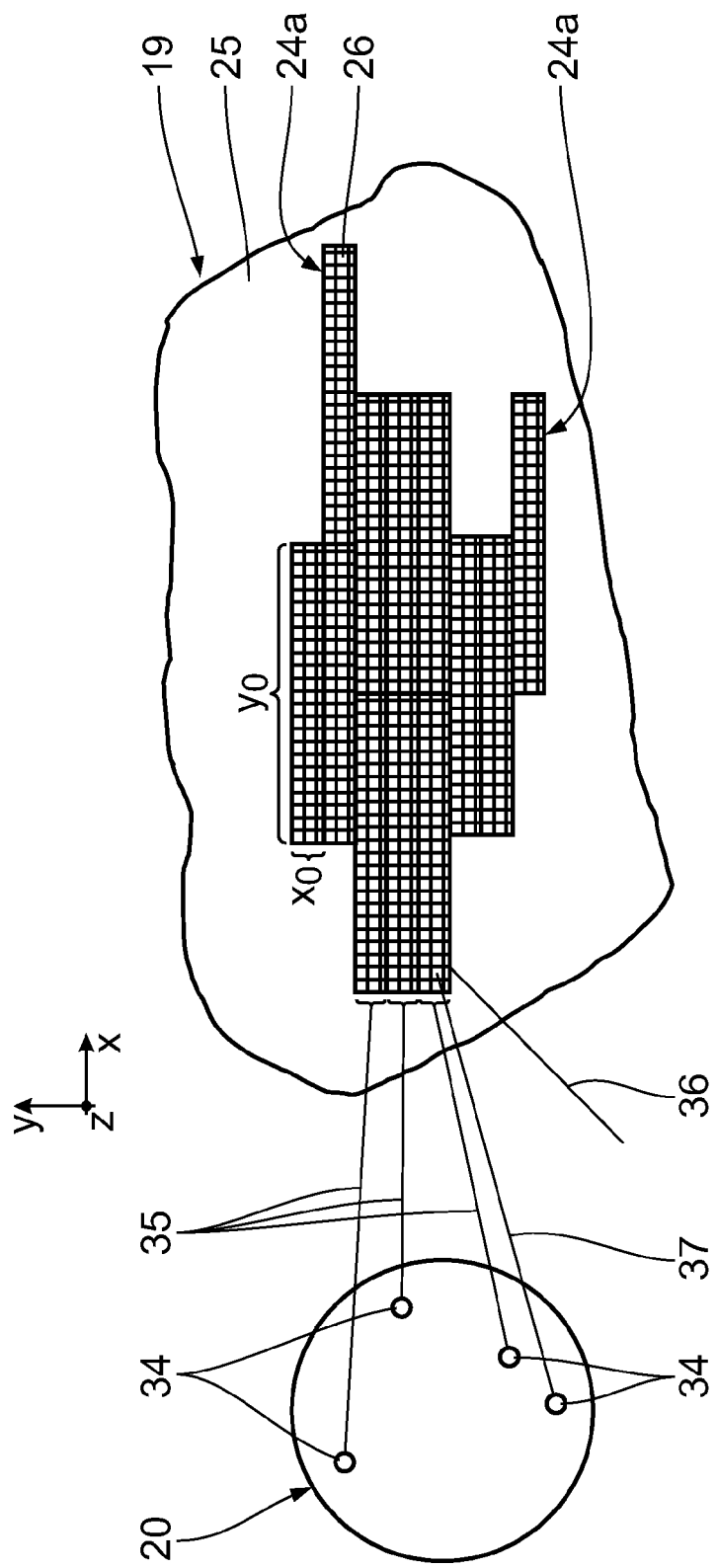
FIG. 7 shows a plan view of an excerpt of an embodiment of a field facet mirror constructed from individual mirrors with an exemplary grouping of the individual mirrors into an arrangement of individual-mirror groups, the figure also indicating by way of example an assignment of some of the individual-mirror groups to two facets of a second facet mirror, likewise illustrated in a plan view on the left in FIG. 7, via group-mirror illumination channels.

FIG. 7 illustrates such a grouping. The illustration shows an excerpt from the reflection surface 25 of a field facet plate of a variant of the field facet mirror 19 having a larger number of individual mirrors 26 in comparison with the illustration according to FIG. 2. Components corresponding to those which have already been explained above with reference to FIGS. 2 to 6 bear the same reference numerals and will not be discussed in specific detail again.

Through corresponding combination of the drivings by the control device 33, a total of twelve individual-mirror groups 24a are formed within the reflection surface 25 in the case of the example in FIG. 7. The individual-mirror groups 24a each have the same x/y aspect ratio. Each of the individual-mirror groups 24a consists of a 24×3 array of individual mirrors 26, that is to say has three individual-mirror rows each having twenty-four individual mirrors 26. Each of the individual-mirror groups 24a therefore has an aspect ratio of 8 to 1. This aspect ratio corresponds to the aspect ratio of the object field 5 to be illuminated. Differences in aspect ratio which occur on account of detail changes during the imaging of the respective individual-mirror group 24a into the object field 5 on account of a change in the ray geometry depending on the tilting position of the individual mirrors 26 are disregarded in this case.

Within each of the individual-mirror groups 24a, the individual mirrors 26 are oriented with respect to one another in such a way that the form of each of the individual-mirror groups 24a corresponds to the form of an individual field facet of a conventional field facet mirror. The images of the individual mirrors 26 of the respective individual-mirror group 24a complement one another in the object field 5 with respect to the entire object field 5.

FIG. 7 schematically shows an assignment of three of the individual-mirror groups 24a via group-mirror illumination channels 35 to three pupil facets 34 of the pupil facet mirror 20.

Figure 8:
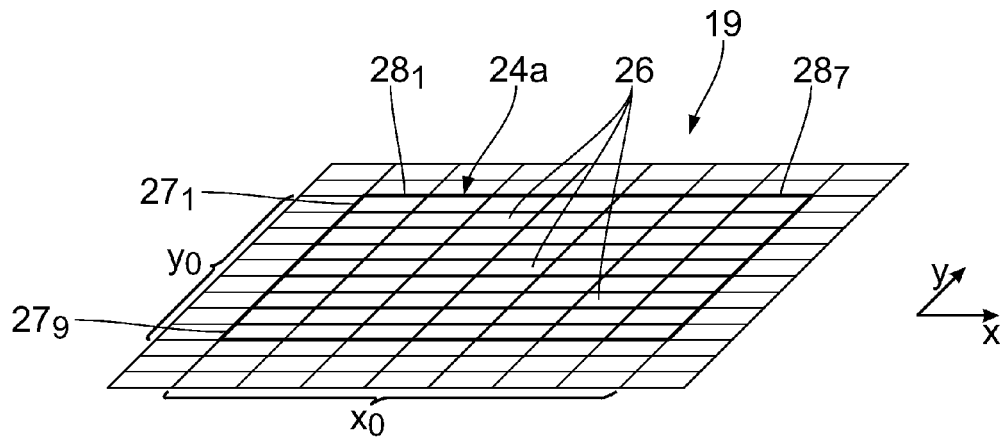
FIG. 8 shows a perspective view of an excerpt from an embodiment of a field facet mirror constructed from individual mirrors, with an exemplary grouping of the individual mirrors to form an individual-mirror group.

FIG. 8 shows a further variant of an individual-mirror group 24a within an excerpt from the field facet mirror 19. The individual-mirror group 24a according to FIG. 19 has nine individual-mirror rows $27_1$ to $27_9$ each having seven individual-mirror columns $28_1$ to $28_7$.

Figure 9:
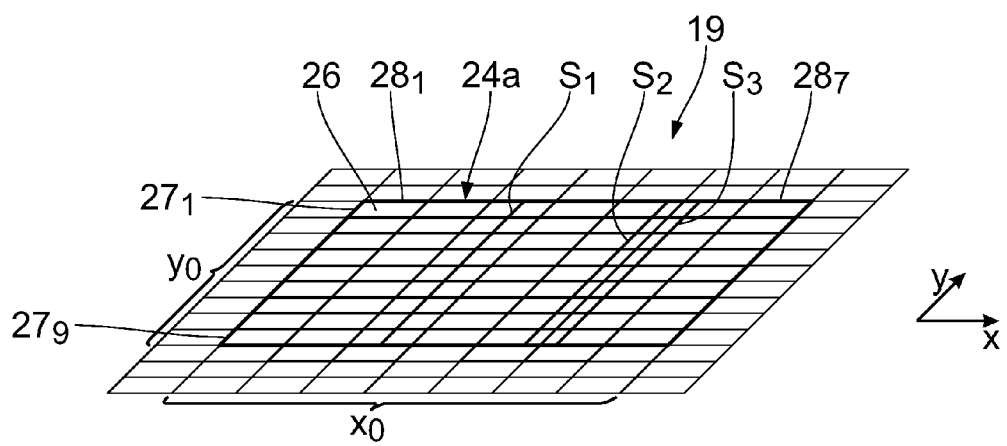
FIG. 9 shows the excerpt from the field facet mirror according to FIG. 8, wherein scanning lines along the individual-mirror group are highlighted which correspond to imaged scanning displacement paths through an object field along which object points on a lithography mask are linearly displaced during a projection exposure scanning process.

FIG. 9 shows the excerpt from the field facet mirror 19 according to FIG. 8, wherein the illustration additionally shows three scanning lines $S_1$, $S_2$ and $S_3$ which run parallel to the y-direction, that is to say parallel to the displacement direction of the object holder 8 and of the wafer holder 14. The scanning lines $S_1$ to $S_3$ respectively run along one of the individual-mirror columns 28. The scanning lines $S_1$ to $S_3$ correspond to images of scanning displacement paths of object points on the reticle 7 along the scanning displacement thereof through the object field 5 during the projection exposure. Since the individual-mirror group 24a is imaged onto the object field 5, the object field point respectively displaced along the scanning displacement paths, "sees" the individual mirrors 26 arranged along the scanning lines $S_1$, $S_2$ and $S_3$.

The individual mirrors 26 of the individual-mirror group 24a according to FIG. 9 can all be oriented such that the individual-mirror illumination channels along which the illumination light is guided via the individual mirrors 26 and the pupil facet mirror 20 to the object field 5 all contribute to one and the same group illumination channel 35 (FIG. 7), which guides the illumination light 16 via one and the same pupil facet 34 (FIG. 7) of the pupil facet mirror 20 toward the object field 5. Alternatively, it is possible to tilt specific or all of the individual mirrors 26 of the individual-mirror group 24a into a different tilting position such that the tilted individual mirrors 26 either guide the illumination light 16 via a different pupil facet 34 of the pupil facet mirror 20 toward the object field 5 in comparison with the other individual mirrors 26 of the individual-mirror group 24a that are not brought into the tilting position, with the result that the illumination is effected via the individual-mirror illumination channels of the tilted individual mirrors 26 from a different illumination direction. Such an alternative individual-mirror illumination channel is shown schematically at 37 in FIG. 7. It is likewise alternatively possible to tilt the individual mirrors 26 such that the illumination light 16 which is guided via these tilted individual mirrors 26 no longer contributes at all to the illumination of the object field 5, that is to say is guided away in a defined manner. This guiding away is effected via a switch-off illumination channel. Such a switch-off illumination channel which does not guide the illumination light to the pupil facet mirror 20 is shown schematically at 36 in FIG. 7.

Figure 10:
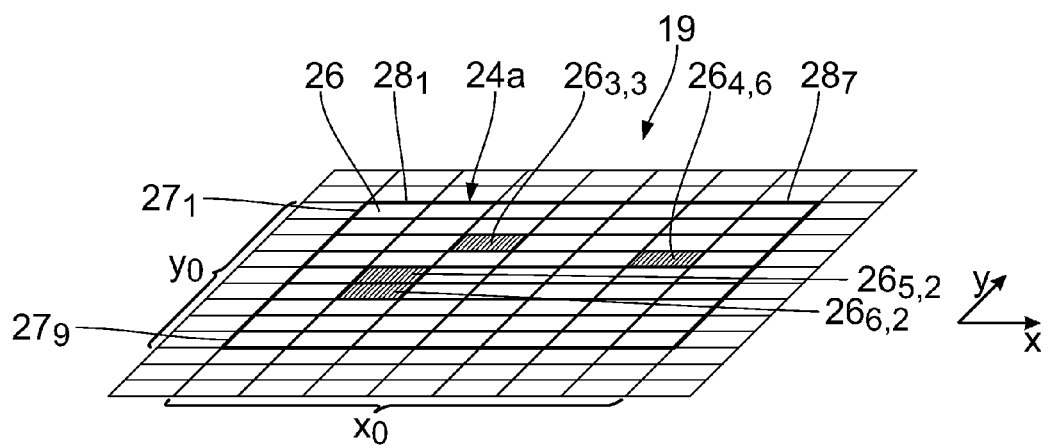
FIG. 10 shows an exemplary group tilting switching state or a tilting position distribution of the individual-mirror group in the view according to FIGS. 8 and 9, wherein individual mirrors are highlighted whose individual-mirror illumination channels either do not contribute at all or contribute to the object field illumination via a different facet of a pupil facet mirror disposed downstream of the field facet mirror in comparison with the other individual mirrors of this individual-mirror group.

FIG. 10 shows such a group tilting switching state of the individual mirrors 26 of the individual-mirror group 24a, this state also being designated as tilting position distribution. In order to facilitate the identification of the individual mirror 26 respectively meant within the individual-mirror group 24a, the mirror is provided with an indexing $26_{i,j}$, wherein i denotes the row position and j the column position of the respective individual mirror 26. In the case of the group tilting switching state according to FIG. 10, the individual mirrors $26_{5,2}$, $26_{6,2}$, $26_{3,3}$ and $26_{4,6}$ are brought into a different tilting position than all the other individual mirrors 26 of the individual-mirror group 24a. The illumination light 16 which impinges on these other individual mirrors 26 is guided via a common group illumination channel via one and the same pupil facet 34 of the pupil facet mirror 20 toward the object field 5. The illumination light 16 which impinges on the tilted individual mirrors $26_{5,2}$, $26_{6,2}$, $26_{3,3}$ and $26_{4,6}$ can be guided, depending on the tilting position chosen, as follows:

the illumination light 16 can be guided toward the object field 5 via a different pupil facet 34 of the pupil facet mirror 20 than the pupil facet 34 via which the illumination light 16 of all the other individual mirrors 26 of the individual-mirror group 24a is guided. In this case, the individual mirrors $26_{5,2}$, $26_{6,2}$, $26_{3,3}$ and $26_{4,6}$ contribute to the illumination of the object field 5 from a different direction than the other individual mirrors 26 of the individual-mirror group 24a. In this case, it is possible for the tilted individual mirrors $26_{5,2}$, $26_{6,2}$, $26_{3,3}$ and $26_{4,6}$ to guide the illumination light via their respective individual-mirror illumination channels all toward the same pupil facet 34 or else for their part to guide the illumination light 16 once again to different pupil facets 34 of the pupil facet mirror 20. It is thus possible, for example, for the individual mirror $26_{5,2}$ and the individual mirror $26_{6,2}$ to be tilted such that they apply light to one and the same pupil facets 34, whereas the individual mirrors $26_{3,3}$ and $26_{4,6}$ apply the illumination light 16 to a further pupil facet 34, such that the individual mirrors 26 of the individual-mirror group 24a apply the illumination light 16 to a total of three pupil facets 34 of the pupil facet mirror 20. In principle, the individual mirrors $26_{5,2}$, $26_{6,2}$, $26_{3,3}$ and $26_{4,6}$ can even apply light to four different pupil facets 34, such that the entire individual-mirror group 24a in the group tilting switching state according to FIG. 10 can apply light to up to five pupil facets 34.

Alternatively, it is possible for at least one of the individual mirrors $26_{5,2}$, $26_{6,2}$, $26_{3,3}$ and $26_{4,6}$ to be tilted or swung away such that the illumination light is no longer fed to the object field 5 at all via this individual mirror 26, that is to say does not contribute to the projection exposure of the reticle 7. This can be used for influencing an intensity distribution of the illumination light 16 when it is applied to the object field 5. If, by way of example, all the individual mirrors $26_{5,2}$, $26_{6,2}$, $26_{3,3}$ and $26_{4,6}$ are swung away, i.e. do not guide the illumination light 16 to the object field 5, rather than nine now only seven of the individual mirrors in the individual-mirror column $28_2$ contribute to the object field illumination, rather than nine now only eight individual mirrors in the individual-mirror column $28_3$ contribute, and rather than nine now only eight of the individual mirrors 26 in the individual-mirror column $28_6$, too, contribute. This results in a corresponding reduction of the illumination light intensity that is applied to object points on the reticle 7 which are displaced along scanning displacement paths through the object field 5 whose scanning lines run along the individual-mirror columns $28_2$, $28_3$ and $28_7$.

If the illumination light 16 of the tilted individual mirrors $26_{5,2}$, $26_{6,2}$, $26_{3,3}$ and $26_{4,6}$ is used for illuminating the object field 5 via at least one other pupil facet 34 of the pupil facet mirror 20 in comparison with the illumination light 16 guided via the other individual mirrors 20 of the individual-mirror group 24a, this can be used to feed the illumination light 16 to the object field 5 from different illumination light directions with an illumination light intensity distribution adapted in each case via the object field 5. This will be explained in greater detail below with reference to FIGS. 11 to 15:

FIGS. 11 to 15 in each case schematically show the pupil facet mirror 20 with three selected pupil facets $34_1$, $34_2$ and $34_3$.

Figure 11:
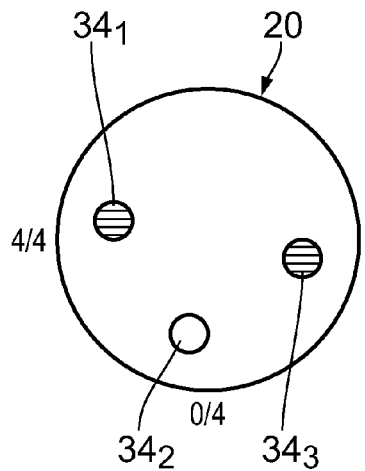
FIGS. 11 to 15 show, in a schematic plan view of the pupil facet mirror, variants of an illumination distribution of a total of three second facets which are illuminated via two individual-mirror groups of the field facet mirror.

In the case of the illumination geometry according to FIG. 11, the pupil facet $34_1$ is illuminated via all the individual-mirror illumination channels of a first individual-mirror group 24a on the field facet mirror 19, such that this first individual-mirror group 24a contributes to the illumination of the object field 5 from the direction of the pupil facet $34_1$. The pupil facet $34_2$ is unilluminated in the case of the illumination geometry according to FIG. 11. Therefore, the object field 5 is not illuminated from the direction of the pupil facet $34_2$. The pupil facet $34_3$ is illuminated by a different individual-mirror group 24a on the field facet mirror 19. The object field 5 therefore "sees" the illumination light 16, guided via two individual-mirror groups 24a, from the direction of the two pupil facets $34_1$ and $34_3$.

Figure 12:
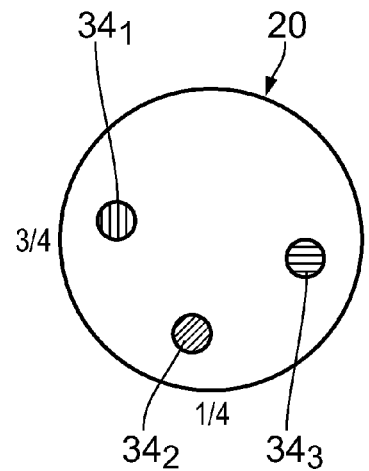

In the case of the illumination geometry according to FIG. 12, one quarter of all the individual mirrors of the individual-mirror group 24a which previously illuminated the pupil facet $34_1$ is now tilted such that the illumination light 16 is now guided toward the pupil facet $34_2$. The object field 5 now "sees" the illumination light 16 from the direction of the pupil facet $34_1$ with the relative intensity ¾, from the direction of the pupil facet $34_2$ with the relative intensity ¼ and from the direction of the pupil facet $34_3$, the illumination of which has remained unchanged, with the relative intensity 1. The pupil facets $34_1$, $34_2$ and $34_3$ are therefore illuminated with the relative intensities ¾, ¼ and 1.

Figure 13:
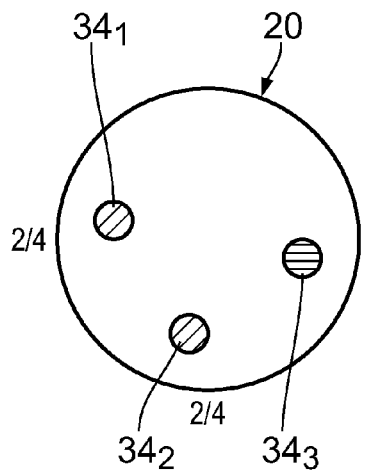

In the case of the illumination geometry according to FIG. 13 half of the individual mirrors 26 which contributed to the illumination of the pupil facet $34_1$ in the case of the illumination geometry according to FIG. 11 are now tilted such that the illumination light 16 is now guided via the tilted individual mirrors 26 toward the pupil facet 34₂. The pupil facets 34₁, 34₂ and 34₃ are now illuminated with the relative intensities ½, ½ and 1.

Figure 14:
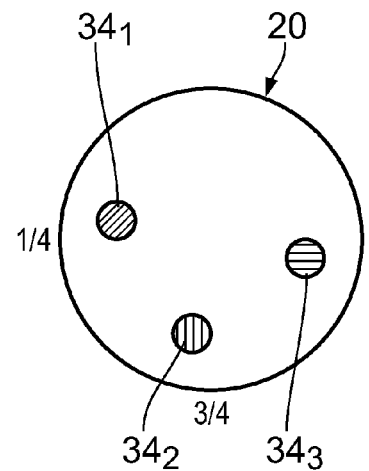

In the case of the illumination geometry according to FIG. 14, three quarters of the individual mirrors 26 which contributed to the illumination of the pupil facet 34₂ in the case of the illumination geometry according to FIG. 11 are now tilted such that the illumination light 16 is now guided via three quarters of the individual mirrors 26 toward the pupil facet 34₂. The pupil facets 34ᵢ, 34₂ and 34₃ are now illuminated with the relative intensities ¼, ¾ and 1.

Figure 15:
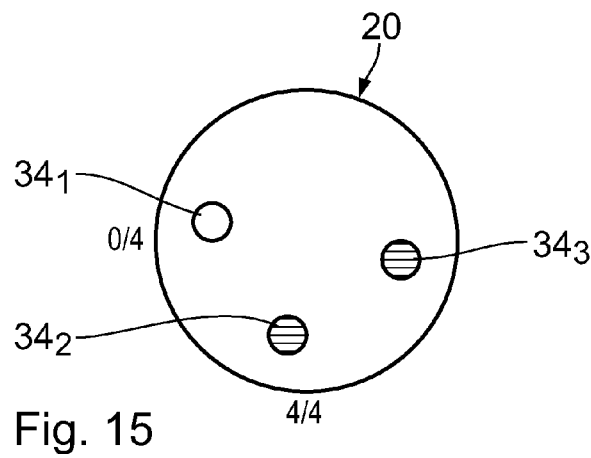

In the case of the illumination geometry according to FIG. 15, all of the individual mirrors 26 which contributed to the illumination of the pupil facet 34₁ in the case of the illumination geometry according to FIG. 11 are now tilted such that the illumination light 16 is now guided via all the individual mirrors 26 toward the pupil facet 34₂. The pupil facets 34ᵢ, 34₂ and 34₃ are now illuminated with the relative intensities 0, 1 and 1.

In the case of the illumination geometries according to FIGS. 12 to 14, it is possible to bring about the situation that a first illumination angle distribution is applied to parts of the object field 5 and a second illumination angle distribution is applied to other parts of the object field 5.

It can be gathered, for example, from the sequence of the illumination geometries according to FIGS. 11 to 15 that a quasi-continuous transition of the illumination from different illumination directions is possible by corresponding tilting of individual mirrors 26 within the individual-mirror group 24a. A fineness of an adaptation of the relative illumination intensities from the direction of the different pupil facets can be influenced by the predefinition of the number of individual mirrors 26 within the individual-mirror groups 24a. In the case of the 24×3 arrays of the individual-mirror groups 24a according to FIG. 7, it is possible to perform the relative intensity influencing along the scanning direction accurately to ⅓: accurately to ⅑ in the case of the 7×9 arrays.

An adaptation of the illumination system 3 to the properties of the respective light source 2 is thus possible.

For adapting the illumination intensity distribution over the different illumination directions predefined by the position of the pupil facets 34 on the pupil facet mirror 20, that is to say for adapting the illumination geometry, it is possible to use the following algorithm:

A virtual field facet i is considered, that is to say an individual-mirror group 24a which can illuminate different pupil facets 34. The switching position of the i-th virtual field facet is indicated by $j_i$.

If a specific structure on the lithography mask 7 is designated by k, then there arises at the field point 1 at a desired structure edge position an aerial image intensity, that is to say an intensity of the illumination light 16 at the location of the image field 11 of $$I_i^{(j,k)} = a_{ij,k} \qquad (1)$$

$a_{ij,k}$ is the intensity proportion of the field facet i in the switching position j, at the location of the structure k (k-th structure) in the image field 11. The total aerial image intensity for the k-th structure then results by summation over all the virtual field facets $$I_i^{(k)} \sum_i a_{ij_i k} \qquad (2)$$

the result depending on the positions $j_i$ of the virtual field facets. In order to be able to write everything more simply, it is firstly assumed that there are only two switching positions, designated by "1" and "2", that is to say $j_i \in \{1, 2\}$. This corresponds to a conventional illumination optical unit including monolithic field facets. The above equation can then be written as follows:

$$I_i^k = \sum_i (2-j_i)a_{i1k} + (j_i-1)a_{i2k} \qquad (3)$$

This can be summarized as $$I_i^{(k)} = \sum_i 2a_{i1k} - a_{i2k} + \sum_i j_i(a_{i2k} - a_{i1k}) \qquad (4)$$

This is a linear equation. The solution of such linear equation systems is dealt with comprehensively in the mathematical literature.

The aim when setting an illumination geometry for the illumination system 3 is for all structures on the reticle 7 to have the same intensity $I_0$ as at a desired structure edge position, the intensity then being chosen as resist threshold for a coating that is sensitive to the illumination light 16 on the wafer 13.

$$I_0 = I_i^{(k)} = \sum_i 2a_{i1k} - a_{i2k} + \sum_i j_i(a_{i2k} - a_{i1k}) \qquad (5)$$

As far as the setting of the illumination geometry is concerned, this equation is an optimization task: find the best values for $j_i$ such that this equation is fulfilled as well as possible.

In actual fact, $j_i \in \{1; 2\}$ does not hold true, but rather $j_i \in [1; 2]$, since, as already explained above with reference to FIGS. 11 to 15, there is a quasi-continuum of switching positions. The number of intermediate positions depends on the number of individual mirrors 26 from which the respective individual-mirror group 24a is constructed. The solution of equation (5) can then be calculated directly using corresponding optimization algorithms. Even if the solution is fixed at discrete values, but the number of these discrete values is >>1, there are efficient algorithms—the larger the number of discrete values allowed, the better.

These algorithms are based firstly on solving the continuous problem. Afterward, individual components $j_i$ of the continuous solutions are set to different allowed discrete values, e.g. the two allowed discrete values which are closest to the continuous solution, such that a large number of combinations have to be tried out. If 1.05, for example, results for the value $j_i$, then this means that, in the case of an individual-mirror group having 100 individual mirrors, five of these individual mirrors are to be put into one of the switching or tilting positions and 95 of the individual mirrors are to be put into another switching position. If the new continuous problem that then arises is solved for the remaining components, this yields an estimation for the quality of the solution achievable in the best case. If this is poor, there is no need to search for a discrete solution for the remaining, still continuous components of the solution vector. This allows the solution tree to be rapidly and effectively trimmed.

On account of the earliest possible pruning of fruitless parts of the solution tree (based on the steps "consider a number of possibilities" and "discard on the basis of an estimation"), these algorithms are designated as "Branch and Bound". An overview can be found for example in "Branch-And-Bound Methods: A Survey" by E. L. Lawler and D. E. Wood, published on pages 699-719 of the journal "Operations Research", Volume 14 (1966).

For setting an illumination geometry of the illumination optical unit 4 of the illumination system 3, firstly a desired illumination geometry is predefined on the basis of equation (1) above. The desired illumination geometry is predefined depending on the structure to be imaged on the reticle 7. This is followed by varying tilting angles of the individual mirrors 26 within one and the same individual-mirror group 24a by predefining the respective switching position and with the aid of the optimization algorithm discussed above. This variation takes place in such a way that tilting position distributions or group tilting switching states of the individual mirrors 26 within the individual-mirror group 24a are permitted in which at least one first tilting position is present in which the respective individual mirror is assigned via a first group illumination channel 35 to a first pupil facet, that is to say the pupil facet $34_1$, for example, and in which at least one further tilting position of at least one of the individual mirrors 26 is present in which the latter is assigned via a further illumination channel to a further pupil facet, for example the pupil facet $34_2$, or is assigned to a switch-off illumination channel.

This variation of the individual-mirror tilting angles is effected with the aid of the optimization algorithm until an actual illumination geometry corresponds to the desired illumination geometry within a predefined tolerance.

In this case, the variation of the tilting angles of the individual mirrors 26 is carried out for all individual-mirror groups 24a which are assigned in each case via a dedicated group-mirror illumination channel to a dedicated second facet, that is to say a dedicated pupil facet 34 of the pupil facet mirror 20.

As soon as a discrete, that is to say allowed, solution of equation (5) has been found in the context of the variation, the tilting angles of the individual mirrors 26 directly result therefrom.

During projection exposure with the aid of the projection exposure apparatus 1, firstly an illumination geometry is set with the aid of the setting method explained above. At least one part of the reticle 7 in the object field 5 is then imaged onto a region of the light-sensitive layer onto the wafer 13 in the image field 11 for the lithographic production of a micro- or nanostructured component, in particular of a semiconductor component, for example of a microchip. In this case, the reticle 7 and the wafer 13 are moved in a temporally synchronized manner in the y-direction continuously in a scanner operation.

What is claimed is:

1. A method for setting an illumination geometry for an illumination optical unit for EUV projection lithography for guiding illumination light toward an object field in which a lithography mask can be arranged, the illumination optical unit comprising a first facet mirror having a multiplicity of individual mirrors which can be switched between at least two tilting positions and which provide individual-mirror illumination channels for guiding illumination light partial beams toward the object field, the illumination optical unit comprising a second facet mirror downstream of the first facet mirror in the beam path of the illumination light and having a plurality of facets which each contribute to the imaging of a group of the individual mirrors of the first facet mirror into the object field via a group-mirror illumination channel, wherein the images of the individual mirrors of a respective individual-mirror group in the object field complement one another for illumination of the entire object field, the method comprising:

predefining a desired illumination geometry; and
varying tilting angles of the individual mirrors within one and the same individual-mirror group, wherein the individual mirrors:
in a first tilting position are assigned via a first group-mirror illumination channel to a first facet of the second facet mirror; and
in at least one further tilting position:
are assigned via a further illumination channel to a further facet of the second facet mirror; or
are assigned to a switch-off illumination channel by which the illumination light guided via the individual mirror does not contribute to the illumination of the object field,
wherein tilting position distributions of the individual mirrors within the individual-mirror group are permitted in which at least one first tilting position and at least one further tilting position are present until an actual illumination geometry corresponds to the desired illumination geometry within predefined tolerances.

2. The method according to claim 1, wherein varying the tilting angles of the individual mirrors is carried out for all individual-mirror groups which are assigned respectively via a dedicated group-mirror illumination channel to a dedicated second facet.

3. A method for projection exposure, the method comprising:

providing a projection exposure apparatus, comprising:
an illumination system comprising an illumination optical unit for guiding illumination light toward an object field in which a lithography mask can be arranged;
a projection optical unit for imaging the object field into an image field;
an EUV light source;
an object holder for mounting the lithography mask in the object field; and
a wafer holder for mounting a wafer in the image field;
setting an illumination geometry using a method according to claim 1;
providing the wafer;
providing the lithography mask; and
projecting at least one part of the lithography mask onto a region of a light-sensitive layer of the wafer with the aid of the projection optical unit of the projection exposure apparatus.

4. The method according to claim 3, wherein the desired illumination geometry is predefined depending on the structure to be imaged on the lithography mask.

5. A method for projection exposure, the method comprising:

providing a projection exposure apparatus, comprising:
an illumination system comprising an illumination optical unit for guiding illumination light toward an object field in which a lithography mask can be arranged;
a projection optical unit for imaging the object field into an image field;
an EUV light source;

an object holder for mounting the lithography mask in the object field; and a wafer holder for mounting a wafer in the image field;

setting an illumination geometry using a method according to claim 2;

providing the wafer;

providing the lithography mask; and projecting at least one part of the lithography mask onto a region of a light-sensitive layer of the wafer with the aid of the projection optical unit of the projection exposure apparatus.

6. The method according to claim 5, wherein the desired illumination geometry is predefined depending on the structure to be imaged on the lithography mask.

* * * * *

UNITED STATES PATENT AND TRADEMARK OFFICE
CERTIFICATE OF CORRECTION

PATENT NO. : 8,514,372 B1
APPLICATION NO. : 13/732900
DATED : August 20, 2013
INVENTOR(S) : Michael Patra It is certified that error appears in the above-identified patent and that said Letters Patent is hereby corrected as shown below:

Title Page, Col. 2, (Abstract) line 5, delete "the a" and insert --a--.

In the Specification

Col. 1, line 33, delete "devices" and insert --devices.--.

Col. 4, line 43, delete "recticle" and insert --reticle--.

Col. 11, line 13, delete "$34_i,$" and insert --$34_1$,--.

Col. 11, line 20, delete "$34_i,$" and insert --$34_1$,--.

Col. 12, line 1-4, delete "$I_l^{(k)} \sum_i a_{ij,k}$" and insert --$I_l^{(k)} = \sum_i a_{ij,k}$--.

Signed and Sealed this
Twelfth Day of November, 2013

Teresa Stanek Rea
*Deputy Director of the United States Patent and Trademark Office*